(12) United States Patent
Hsu

(10) Patent No.: US 6,977,815 B2
(45) Date of Patent: Dec. 20, 2005

(54) POWER ADAPTER WITH HEAT SINK DEVICE

(75) Inventor: Cheng-Lung Hsu, Tamsui (TW)

(73) Assignee: AcBel PolyTech Inc., Taipei (TW)

( * ) Notice: Subject to any disclaimer, the term of this patent is extended or adjusted under 35 U.S.C. 154(b) by 5 days.

(21) Appl. No.: 10/841,166

(22) Filed: May 6, 2004

(65) Prior Publication Data

US 2005/0248923 A1 Nov. 10, 2005

(51) Int. Cl.[7] ............................................. H05K 7/20
(52) U.S. Cl. .................. 361/704; 361/707; 361/709; 165/80.3; 165/185; 174/16.3
(58) Field of Search ................ 361/688–690, 361/697, 702–704, 707, 709, 719; 165/80.3, 165/185; 174/16.1, 16.3; 257/718, 727

(56) References Cited

U.S. PATENT DOCUMENTS

| 5,287,001 A | * | 2/1994 | Buchmann et al. | ......... 257/719 |
| 5,726,858 A | * | 3/1998 | Smith et al. | ................. 361/705 |
| 5,777,844 A | * | 7/1998 | Kiefer | .......................... 361/704 |
| 6,025,991 A | * | 2/2000 | Saito | ............................. 361/704 |
| 6,034,874 A | * | 3/2000 | Watanabe | .................... 361/704 |
| 6,320,748 B1 | * | 11/2001 | Roden et al. | ................ 361/704 |
| 6,700,782 B1 | * | 3/2004 | Bopp et al. | .................. 361/704 |
| 6,728,104 B1 | * | 4/2004 | Ahmad et al. | ............... 361/704 |

* cited by examiner

Primary Examiner—Boris Chérvinsky
(74) Attorney, Agent, or Firm—Charles E. Baxley

(57) ABSTRACT

A power adapter includes an insulating casing including an enclosing wall and defining a sealing chamber therein, a power transforming unit disposed in the sealing chamber, and a heat sink device including a heat dispersing member supported within the sealing chamber at a position between the enclosing wall and the power transforming unit to thermal-communicate with the power transforming unit, wherein the heat dispersing member has an air insulating cavity formed above the power transforming unit in such a manner that when the power transforming unit generates heat for heating up air within the air insulating cavity, the heat is diffused throughout the air insulating cavity so as to evenly disperse on the enclosing wall of the insulating casing.

16 Claims, 3 Drawing Sheets

POWER ADAPTER WITH HEAT SINK DEVICE

BACKGROUND OF THE PRESENT INVENTION

1. Field of Invention

The present invention relates to a power adapter, and more particularly to a power adapter with a heat sink device which is adapted to evenly disperse the heat from the power transforming unit in the insulating casing so as to prevent the heat from concentrating at a region of the insulating casing.

2. Description of Related Arts

Power adapters are known as an electrical bridging device for providing an interface between a power source and an appliance. A conventional power adapter generally comprises an insulating casing and a power transforming device sealedly disposed in the insulating casing. The power transforming device generally comprises a transformer and a PFC (power factor correction) choke, such that when the power transforming device is electrically connected to the power source, the power transforming device is arranged to convert an AC Power from the power source to a DC power for the appliance.

For example, the power adapter is arranged to bridge between the power source and a laptop such that the power adapter is adapted to convert a 110V AC voltage from the power source into a 16V DC voltage to the laptop. In addition, since AC voltage supplies in various countries, the input of the power transforming device is interchangeable to fit different AC voltages, such as 110V and 220V.

However, the conventional power adapter has several drawbacks. During operation, the power transforming device generates heat within the insulating casing. Since the power transforming device is sealed inside the insulating casing to prevent the user from being electric shock, the heat from the power transforming device is trapped in the insulating casing. Unlike other device, the power adapter cannot employ a dispersing fan for dispersing the heat in the insulating casing to outside. Therefore, the heat accumulated within the insulating casing will affect the normal operation of the power transforming device.

In addition, the power transforming device forms as a heat source within the insulating casing such that the wall of insulating casing right above the power transforming device will be heated up rapidly. Accordingly, the insulating casing is made of heat insulating material, such as plastic, having a tolerance up to 95° C., such that the insulating casing will not be melted at normal operation of the power transforming device.

However, since the power transforming device forms as a heat source, a surface of the insulating casing, which is right above the power transforming device, will be heated up substantially. Accordingly, the average surface temperature difference of the insulating casing is 5° C. when the operation of the power transforming device such that it is dangerous when the user touches the insulating casing. In addition, the heat applied on the particular region of the insulating casing will damage the insulating casing so as to loss the sealing insulation ability thereof.

SUMMARY OF THE PRESENT INVENTION

A main object of the present invention is to provide a power adapter with a heat sink device which is adapted to evenly disperse the heat from the power transforming unit in the insulating casing so as to prevent the heat from concentrating at a region of the insulating casing.

Another object of the present invention is to provide a power adapter with a heat sink device, wherein the heat sink device has an air insulating cavity formed between the insulating casing and the power transforming unit such that the heat from the power transforming unit is adapted to evenly spread out on the enclosing wall of the insulating casing throughout the air insulating cavity. In other words, air within the air insulating cavity forms as an air thermal resistance to insulate between the power transforming unit and the enclosing wall of the insulating casing so as to resist the heat directly applying on the insulating casing.

Another object of the present invention is to provide a power adapter with a heat sink device, wherein the air insulating cavity is positioned right above the power transforming unit such that when the air within the air insulating cavity is heated up by the power transforming unit, the air starts to circulate within the insulating casing so as to evenly spread out the heat on the enclosing wall of the insulating casing. In other words, the heat from the power transforming unit can be effectively dispersed to outside through the entire insulating casing.

Another object of the present invention is to provide a power adapter with a heat sink device, wherein the average surface temperature difference of the insulating casing is 2° C. when the operation of the power transforming unit in comparison with the conventional power adapter that the average surface temperature difference of the insulating casing is 5° C. during operation. In other words, it is safer for the user to touch the insulating casing during operation.

Another object of the present invention is to provide a power adapter with a heat sink device, wherein the power adapter does not require altering its original structure in order to incorporate with the heat sink device such that the heat sink device is adapted to install into any kind of power adapter having the insulating casing.

Another object of the present invention is to provide a power adapter with a heat sink device, wherein no expensive or complicated structure is required to employ in the present invention in order to achieve the above mentioned objects. Therefore, the present invention successfully provides an economic and efficient solution not only for providing a simple configuration for evenly dispersing the heat from the power transforming unit but also for enhancing the operation of the power adapter.

Accordingly, in order to accomplish the above objects, the present invention provides a power adapter, comprising:

an insulating casing comprising an enclosing wall and defining a sealing chamber therein;

a power transforming unit disposed in the sealing chamber for converting an input power into an output power; and a heat sink device comprising a heat dispersing member supported within the sealing chamber at a position between the enclosing wall and the power transforming unit to thermal-communicate with the power transforming unit, wherein the heat dispersing member has an air insulating cavity formed above the power transforming unit in such a manner that when the power transforming unit generates heat for heating up air within the air insulating cavity, the heat is diffused throughout the air insulating cavity so as to evenly disperse on the enclosing wall of the insulating casing.

These and other objectives, features, and advantages of the present invention will become apparent from the following detailed description, the accompanying drawings, and the appended claims.

DETAILED DESCRIPTION OF THE PREFERRED EMBODIMENT

Figure 1:
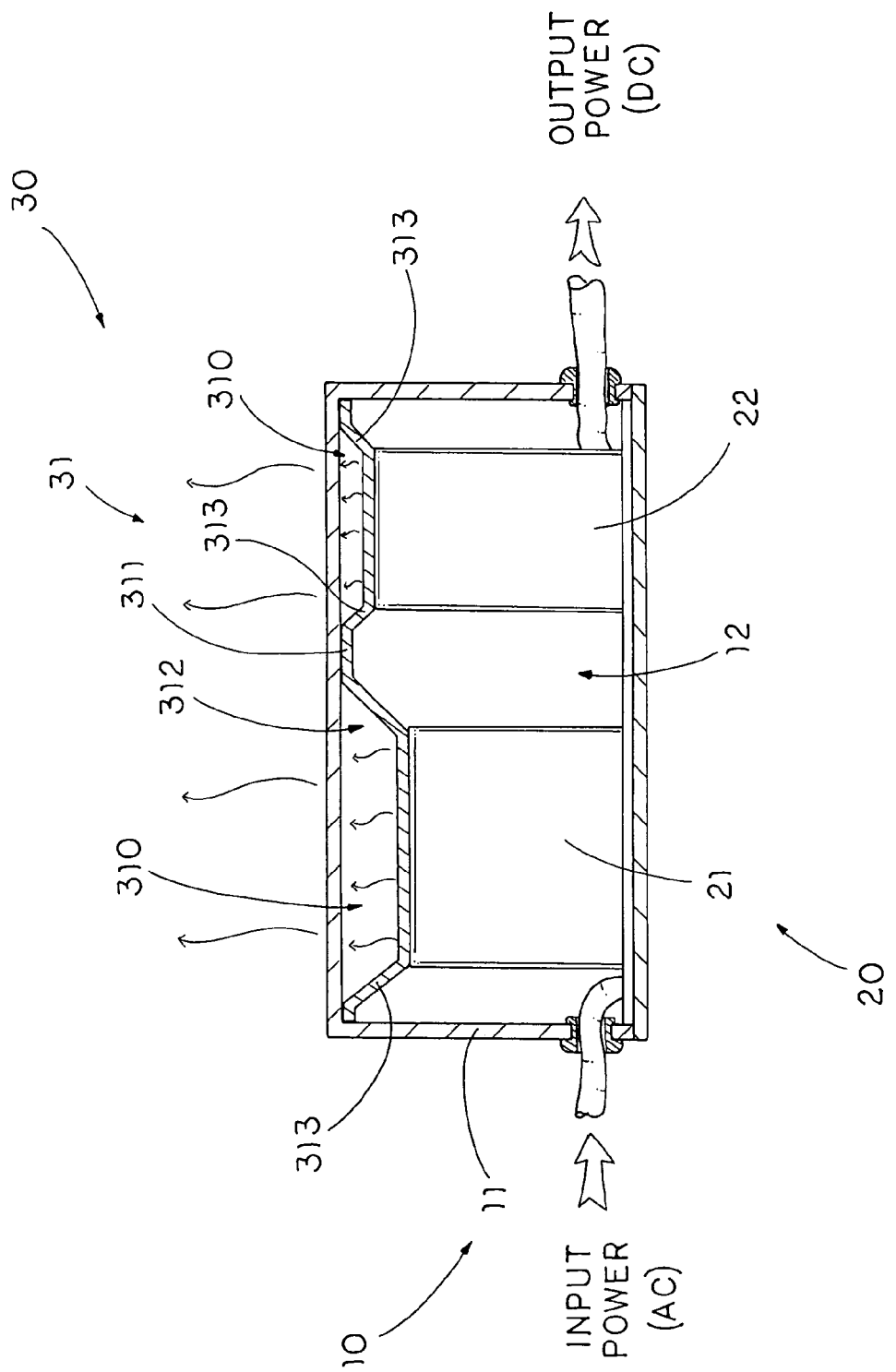
FIG. 1 is a sectional view of a power adapter with a heat sink device according to a preferred embodiment of the present invention.

Referring to FIG. 1 of the drawings, a power adapter according to a preferred embodiment of the present invention is illustrated, wherein the power adapter comprises an insulating casing 10 which comprises an enclosing wall 11 and defines a sealing chamber 12 therein and a power transforming unit 20 disposed in the sealing chamber 12 for converting an input power into an output power.

The power adapter further comprises a heat sink device 30 which comprises a heat dispersing member 31 supported within the sealing chamber 12 at a position between the enclosing wall 11 and the power transforming unit 20 to thermal-communicate with the power transforming unit 20, wherein the heat dispersing member 31 has an air insulating cavity 310 formed above the power transforming unit 20 in such a manner that when the power transforming unit 20 generates heat for heating up air within the air insulating cavity 310, the heat is diffused throughout the air insulating cavity 310 so as to evenly disperse on the enclosing wall 11 of the insulating casing 10.

According to the preferred embodiment, the insulating casing 10 is made of thermal insulation and electrically inert material, such as poly-vinyl-chloride plastic, so as to prevent the thermal deformation of the enclosing wall 11 when the heat is applied thereon and the electric leakage.

The power transforming unit 20, such as a conventional power transforming device, comprises a transformer 21 and a PFC (power factor correction) choke 22 electrically connected to the transformer 21, wherein the power transforming unit 20 is adapted for converting an AC voltage as the input power into a DC voltage as the output power. As it is mentioned above, the AC voltage supplies for the power transforming unit 20 can be varied, such as 110V or 220V, and converts into an optimum output power. Accordingly, the heat is also generated during the operation of the power transforming unit 20.

As shown in FIG. 1, due to the relatively high input power, the power transforming unit 20 is sealed in the insulating casing 10 for preventing the user from being electric shock. Therefore, the heat from the power transforming unit 20 will also trapped within the sealing chamber 12 of the insulating casing 10.

Figure 2:
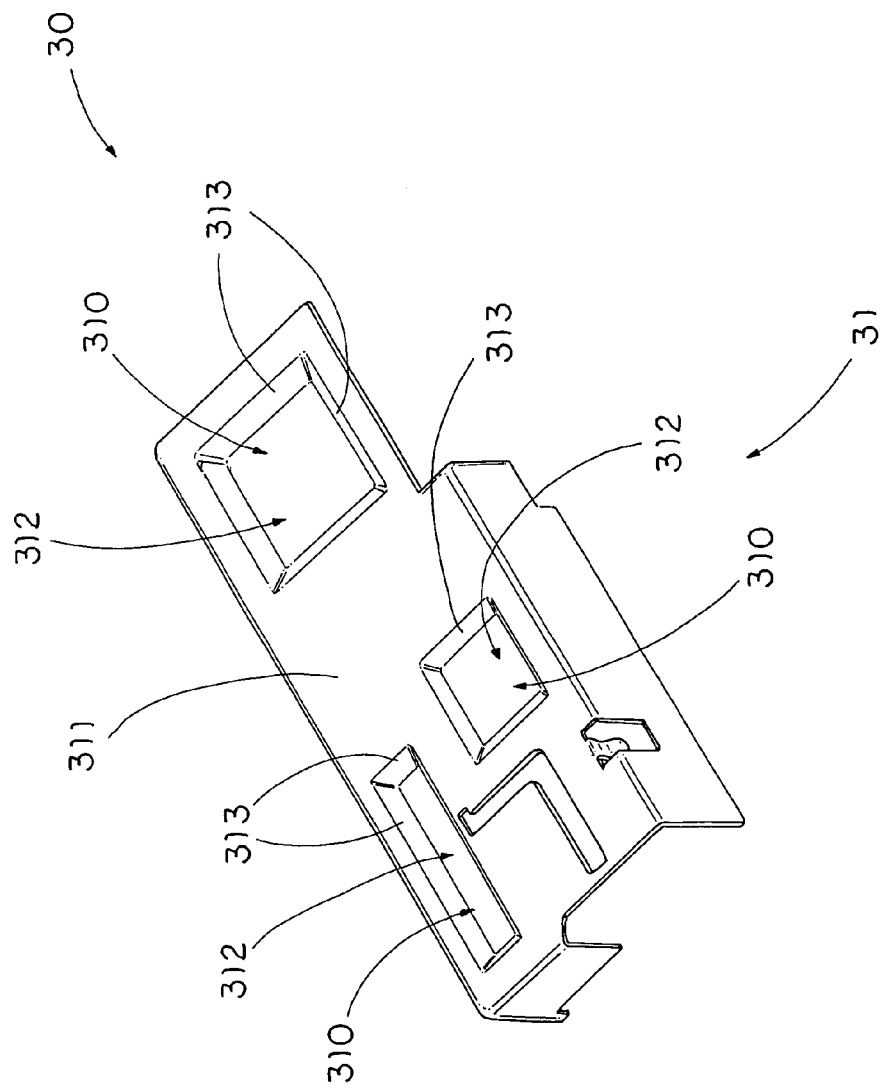
FIG. 2 is a perspective view of the heat sink device of the power adapter according to the above preferred embodiment of the present invention.

According to the preferred embodiment, the heat dispersing member 31 has a heat diffusing panel 311 overlapped on an inner side of the enclosing wall 11 of the insulating casing 10 and an recess portion 312 indented on the heat diffusing panel 311 to form the air insulating cavity 310 above the power transforming unit 20, as shown in FIGS. 1 and 2. In other words, the air insulating cavity 310 is formed within the recess portion 312 of the heat dispersing member 31 at a position between the inner side of the enclosing wall 11 and a bottom wall of the heat dispersing member 31.

As shown in FIG. 2, two or more recess portions 312 can be spacedly indented on the heat diffusing panel 311 of the heat dispersing member 31 to form two or more air insulating cavities 310. Accordingly, both the transformer 21 and a PFC choke 22 generate heat during operation such that the recess portions 312 are indented on the heat dispersing member 31 to form the air insulating cavities 310 at a position above the transformer 21 and a PFC choke 22 respectively. Therefore, the heat from the transformer 21 and a PFC choke 22 can be guided into the air insulating cavities 310 respectively and evenly diffused to the enclosing wall 11 of the insulating casing 10.

In addition, the size of the air insulating cavity 310 can be varied depending on the size of the power transforming unit 20 to effectively diffuse the heat therefrom.

As shown in FIG. 1, the air insulating cavity 310 has a predetermine depth that a bottom wall of the air insulating cavity 310 is downwardly extended to contact with the power transforming unit 20 such that the heat from the power transforming unit 20 is substantially transmitted to the bottom wall of the air insulating cavity 310, i.e. the bottom wall of the heat dispersing member 31, for heating up the air within the air insulating cavity 310. Therefore, the hot air within air insulating cavity 310 starts to circulate such that heat is diffused throughout the air insulating cavity 310 and is evenly disperse on the enclosing wall 11 of the insulating casing 10.

A surrounding sidewall 313 of the air insulating cavity 310 is inclinedly extended from the bottom wall thereof to the heat diffusing panel 311 such that a size of the air insulating cavity 310 is gradually increased from the bottom wall thereof towards the enclosing wall 11 of the insulating casing 10. Therefore, the hot air within the air insulating cavity 310 can be effectively diffused throughout the enclosing wall 11 of the insulating casing 10.

A size of the bottom wall of the air insulating cavity 310 is at least larger than that of a top surface of the power transmitting unit 20 such that when the bottom wall of the air insulating cavity 310 is contacted with the top surface of the power transmitting unit 20, the heat from the power transmitting unit 20 is effectively transmitted to the air insulating cavity 310 through the bottom wall thereof.

In addition, the hot air within the air insulating cavity 310 also flows within the sealing chamber 12 of the insulating housing 10 such that the heat from the power transforming unit 20 will evenly disperse throughout the insulating housing 10.

It is worth to mention that the power transforming unit 20 forms as a point of heat source during operation. The heat from the power transforming unit 20 will directly focus on the inner side of the enclosing wall 11 at a portion right above the power transforming unit 20.

However, when the heat sink device of the present invention is employed with the insulating casing 10, the heat from the power transforming unit 20 will substantially diffused through the air insulating cavity 310 to evenly disperse on the enclosing wall 11. Therefore, the average surface temperature difference of the enclosing wall 11 may be 2° C. when the operation of the power transforming unit 20. In addition, the heat can be effectively dispersed to outside through the insulating casing 10 because the heat contacting area of the enclosing wall 11 is substantially enlarged. In other words, the heat sink device not only evenly disperses the heat from the power transforming unit 20 throughout the enclosing wall 11 but also enhances the operation of the power transforming unit 20 by reducing the interior temperature of the insulating casing 10.

Figure 3:
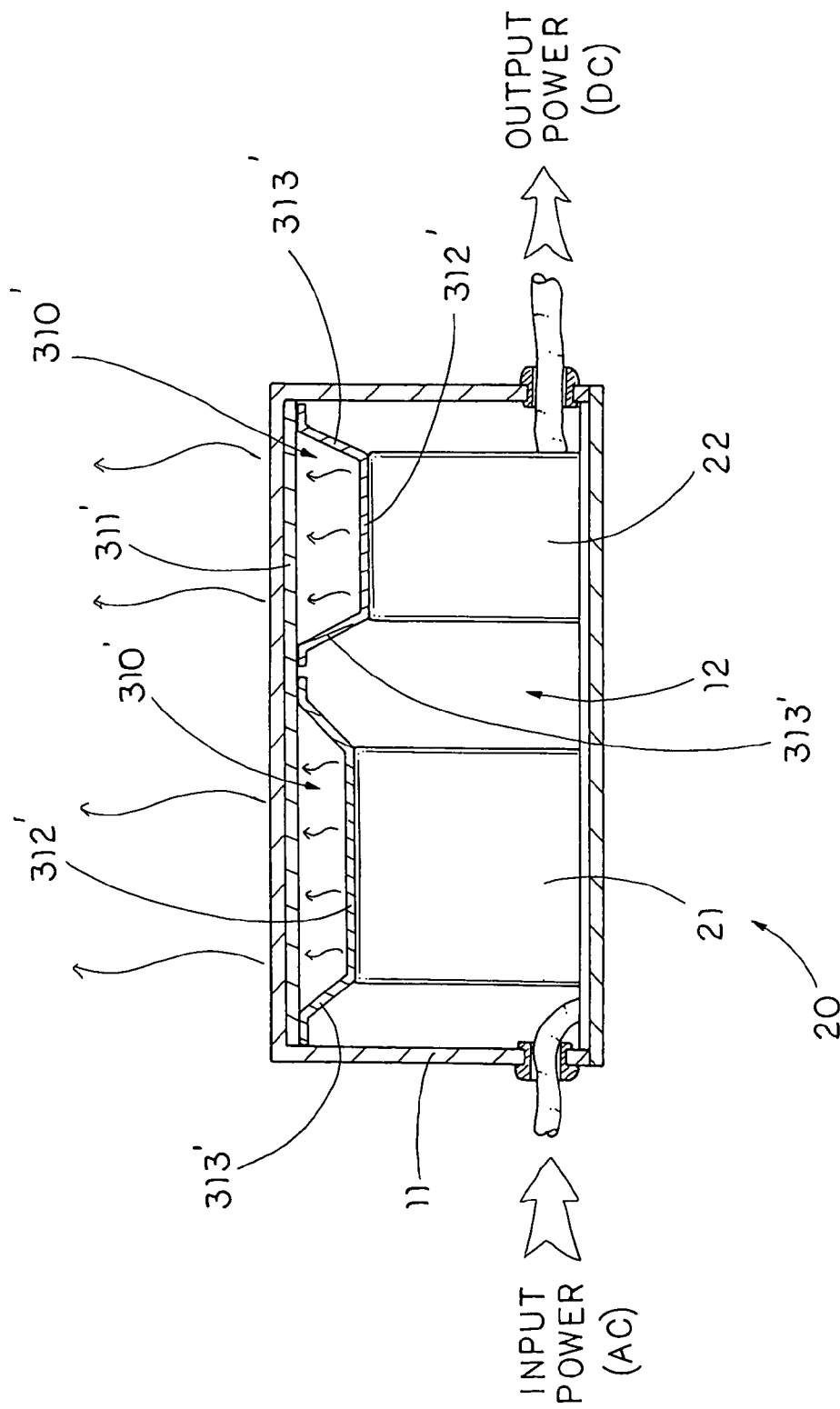
FIG. 3 illustrates an alternative mode of the heat sink device of the power adapter according to the above preferred embodiment of the present invention.

FIG. 3 illustrates an alternative mode of the heat sink device 30' which comprises a heat dispersing member 31' having a heat diffusing panel 311' overlapped on an inner side of the enclosing wall 11 of the insulating casing 10 and a heat transmitting body 312', having a U-shaped cross section, mounted underneath the heat diffusing panel 311' at a position above the power transforming unit 20 to form the air insulating cavity 310' between the heat diffusing panel 311' and a bottom wall of the heat transmitting body 312', as shown in FIG. 3.

Accordingly, the air insulating cavity 310' has a predetermine depth that a bottom wall of the air insulating cavity 310' is downwardly extended to contact with the power transforming unit 20 such that the heat from the power transforming unit 20 is substantially transmitted to the bottom wall of the air insulating cavity 310', i.e. the bottom wall of the heat transmitting body 312' for heating up the air within the air insulating cavity 310'.

A surrounding sidewall 313' of the air insulating cavity 310' is inclinedly extended from the bottom wall thereof to the heat diffusing panel 311' such that a size of the air insulating cavity 310' is gradually increased from the bottom wall thereof towards the enclosing wall 11 of the insulating casing 10. Therefore, the hot air within the air insulating cavity 310' can be effectively diffused throughout the enclosing wall 11 of the insulating casing 10.

A size of the bottom wall of the air insulating cavity 310' is substantially larger than that of a top surface of the power transmitting unit 20 such that when the bottom wall of the air insulating cavity 310' is contacted with the top surface of the power transmitting unit 20, the heat from the power transmitting unit 20 is effectively transmitted to the air insulating cavity 310' through the bottom wall thereof.

It is worth to mention that the heat within the air insulating cavity 310' is substantially transmitted to the heat diffusing panel 311' before the heat is transmitted to the enclosing wall 11 of the insulating casing 10, so as to further enhance the heat to evenly disperse on the enclosing wall 11 of the insulating casing 10.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A power adapter, comprising:
   an insulating casing comprising an enclosing wall and defining a sealing chamber therein;
   a power transforming unit disposed in said sealing chamber for converting an input power into an output power; and
   a heat sink device comprising a heat dispersing member supported within said sealing chamber at a position between said enclosing wall and said power transforming unit to thermal-communicate with said power transforming unit, wherein said heat dispersing member has an air insulating cavity formed above said power transforming unit in such a manner that when said power transforming unit generates heat for heating up air within said air insulating cavity, said heat is diffused throughout said air insulating cavity so as to evenly disperse on said enclosing wall of said insulating casing.

2. The power adapter, as recited in claim 1, wherein said heat dispersing member has a heat diffusing panel overlapped on an inner side of said enclosing wall of said insulating casing and an recess portion indented on said heat diffusing panel to form said air insulating cavity above said power transforming unit.

3. The power adapter, as recited in claim 1, wherein said air insulating cavity has a predetermine depth that a bottom wall of said air insulating cavity is downwardly extended to contact with said power transforming unit such that said heat from said power transforming unit is substantially transmitted to said bottom wall of said air insulating cavity for heating up said air within said air insulating cavity.

4. The power adapter, as recited in claim 2, wherein said air insulating cavity has a predetermine depth that a bottom wall of said air insulating cavity is downwardly extended to contact with said power transforming unit such that said heat from said power transforming unit is substantially transmitted to said bottom wall of said air insulating cavity for heating up said air within said air insulating cavity.

5. The power adapter, as recited in claim 3, wherein a size of said bottom wall of said air insulating cavity is at least larger than that of a top surface of said power transforming unit such that when said bottom wall of said air insulating cavity is contacted with said top surface of said power transmitting unit, said heat from said power transmitting unit is effectively transmitted to said air insulating cavity through said bottom wall thereof.

6. The power adapter, as recited in claim 4, wherein a size of said bottom wall of said air insulating cavity is at least larger than that of a top surface of said power transmitting unit such that when said bottom wall of said air insulating cavity is contacted with said top surface of said power transmitting unit, said heat from said power transmitting unit is effectively transmitted to said air insulating cavity through said bottom wall thereof.

7. The power adapter, as recited in claim 1, wherein a surrounding sidewall of said air insulating cavity is inclinedly extended such that a size of the air insulating cavity is gradually increased towards said enclosing wall of said insulating casing.

8. The power adapter, as recited in claim 2, wherein a surrounding sidewall of said air insulating cavity is inclinedly extended such that a size of the air insulating cavity is gradually increased towards said enclosing wall of said insulating casing.

9. The power adapter, as recited in claim 4, wherein a surrounding sidewall of said air insulating cavity is inclinedly extended such that a size of the air insulating cavity is gradually increased towards said enclosing wall of said insulating casing.

10. The power adapter, as recited in claim 6, wherein a surrounding sidewall of said air insulating cavity is inclinedly extended such that a size of the air insulating cavity is gradually increased towards said enclosing wall of said insulating casing.

11. The power adapter, as recited in claim 1, wherein said heat dispersing member has a heat diffusing panel overlapped on an inner side of said enclosing wall of said insulating casing and a heat transmitting body, having a U-shaped cross section, mounted underneath said heat diffusing panel at a position above said power transforming unit to form said air insulating cavity between said heat diffusing panel and said heat transmitting body.

12. The power adapter, as recited in claim 11, wherein said air insulating cavity has a predetermine depth that a bottom wall of said air insulating cavity is downwardly extended to contact with said power transforming unit such that said heat from said power transforming unit is substantially transmitted to said bottom wall of said air insulating cavity for heating up said air within said air insulating cavity.

13. The power adapter, as recited in claim 12, wherein a size of said bottom wall of said air insulating cavity is at least larger than that of a top surface of said power transforming unit such that when said bottom wall of said air insulating cavity is contacted with said top surface of said power transforming unit, said heat from said power transforming unit is effectively transmitted to said air insulating cavity through said bottom wall thereof.

14. The power adapter, as recited in claim 11, wherein a surrounding sidewall of said air insulating cavity is inclinedly extended such that a size of the air insulating cavity is gradually increased towards said enclosing wall of said insulating casing.

15. The power adapter, as recited in claim 12, wherein a surrounding sidewall of said air insulating cavity is inclinedly extended such that a size of the air insulating cavity is gradually increased towards said enclosing wall of said insulating casing.

16. The power adapter, as recited in claim 13, wherein a surrounding sidewall of said air insulating cavity is inclinedly extended such that a size of the air insulating cavity is gradually increased towards said enclosing wall of said insulating casing.

* * * * *